United States Patent
Hsu et al.

(10) Patent No.: US 12,054,382 B2
(45) Date of Patent: Aug. 6, 2024

(54) ROUGHNESS SELECTIVITY FOR MEMS MOVEMENT STICTION REDUCTION

(71) Applicant: Taiwan Semiconductor Manufacturing Company, Ltd., Hsinchu (TW)

(72) Inventors: Hsi-Cheng Hsu, Taichung (TW); Kuo-Hao Lee, Hsinchu (TW); Jui-Chun Weng, Taipei (TW); Ching-Hsiang Hu, Taipei (TW); Ji-Hong Chiang, Changhua (TW); Lavanya Sanagavarapu, Hsinchu (TW); Chia-Yu Lin, Taoyuan (TW); Chia-Chun Hung, Chiayi (TW); Jia-Syuan Li, Hsinchu (TW); Yu-Pei Chiang, Taoyuan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/308,950

(22) Filed: Apr. 28, 2023

(65) Prior Publication Data
US 2023/0264945 A1 Aug. 24, 2023

Related U.S. Application Data

(62) Division of application No. 17/302,484, filed on May 4, 2021, now Pat. No. 11,655,138.

(Continued)

(51) Int. Cl.
*B81B 3/00* (2006.01)
*B81C 1/00* (2006.01)

(52) U.S. Cl.
CPC ........ *B81B 3/0005* (2013.01); *B81C 1/00968* (2013.01); *B81C 2201/112* (2013.01); *B81C 2201/115* (2013.01)

(58) Field of Classification Search
CPC ................. B81B 3/0005; B81B 3/001; B81B 2201/0235; B81B 2201/0242;
(Continued)

(56) References Cited

U.S. PATENT DOCUMENTS 10,173,886 B2 1/2019 Chen et al.
10,513,432 B2 12/2019 Weng et al.
(Continued)

FOREIGN PATENT DOCUMENTS

CN 101274741 A 10/2008
CN 106995204 A 8/2017
(Continued)

*Primary Examiner* — Yasser A Abdelaziz
(74) *Attorney, Agent, or Firm* — Harrity & Harrity, LLP

(57) ABSTRACT

A micro-electromechanical-system (MEMS) device may be formed to include an anti-stiction polysilicon layer on one or more moveable MEMS structures of a device wafer of the MEMS device to reduce, minimize, and/or eliminate stiction between the moveable MEMS structures and other components or structures of the MEMS device. The anti-stiction polysilicon layer may be formed such that a surface roughness of the anti-stiction polysilicon layer is greater than the surface roughness of a bonding polysilicon layer on the surfaces of the device wafer that are to be bonded to a circuitry wafer of the MEMS device. The higher surface roughness of the anti-stiction polysilicon layer may reduce the surface area of the bottom of the moveable MEMS structures, which may reduce the likelihood that the one or more moveable MEMS structures will become stuck to the other components or structures.

20 Claims, 15 Drawing Sheets

Related U.S. Application Data

(60) Provisional application No. 63/198,691, filed on Nov. 4, 2020.

(58) Field of Classification Search
CPC .... B81B 2201/0257; B81B 2201/0264; B81B 2203/0118; B81B 3/0013; B81B 7/02; B81B 2201/01; B81B 2201/0228; B81C 1/00968; B81C 2201/112; B81C 2201/115; B81C 1/00134
See application file for complete search history.

(56) References Cited

U.S. PATENT DOCUMENTS

| | | | |
|---|---|---|---|
| 10,654,707 | B2 | 5/2020 | Chang et al. |
| 2008/0237757 | A1 | 10/2008 | Inoue et al. |
| 2012/0326248 | A1* | 12/2012 | Daneman ................. B81B 7/02 257/415 |
| 2015/0158716 | A1 | 6/2015 | Cheng et al. |
| 2016/0176707 | A1* | 6/2016 | Montez ................. B81B 3/001 257/415 |
| 2016/0332863 | A1 | 11/2016 | Cheng et al. |
| 2017/0217756 | A1* | 8/2017 | Hsieh ................. B81B 3/0005 |
| 2020/0262697 | A1 | 8/2020 | Lee et al. |
| 2020/0270123 | A1 | 8/2020 | Cuthbertson et al. |
| 2021/0107785 | A1 | 4/2021 | Lee et al. |
| 2022/0135397 | A1 | 5/2022 | Hsu et al. |

FOREIGN PATENT DOCUMENTS

| | | |
|---|---|---|
| CN | 110556399 A | 12/2019 |
| TW | 201904858 A | 2/2019 |
| TW | 201910254 A | 3/2019 |

* cited by examiner

ROUGHNESS SELECTIVITY FOR MEMS MOVEMENT STICTION REDUCTION

CROSS-REFERENCE TO RELATED APPLICATIONS

This Patent Application is a divisional of U.S. patent application Ser. No. 17/302,484, filed May 4, 2021, which claims priority to U.S. Provisional Patent Application No. 63/198,691, filed on Nov. 4, 2020, and entitled "ROUGHNESS SELECTIVITY FOR MEMS MOVEMENT STICTION REDUCTION." The disclosure of the prior Applications is considered part of and is incorporated by reference into this Patent Applications.

BACKGROUND

Integrated circuits may be fabricated on a semiconductor wafer. Semiconductor wafers can be stacked or bonded on top of each other to form what is referred to as a three-dimensional integrated circuit. Some semiconductor wafers include micro-electromechanical-system (MEMS) devices, which involve the process of forming micro-structures with dimensions in the micrometer scale (one millionth of a meter). Typically, MEMS devices are built on silicon wafers and realized in thin films of materials. MEMS applications include inertial sensor applications, such as motion sensors, accelerometers, microphones, and gyroscopes. Other MEMS applications include optical applications such as moveable mirrors, and radio frequency (RF) applications such as RF switches and resonators.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
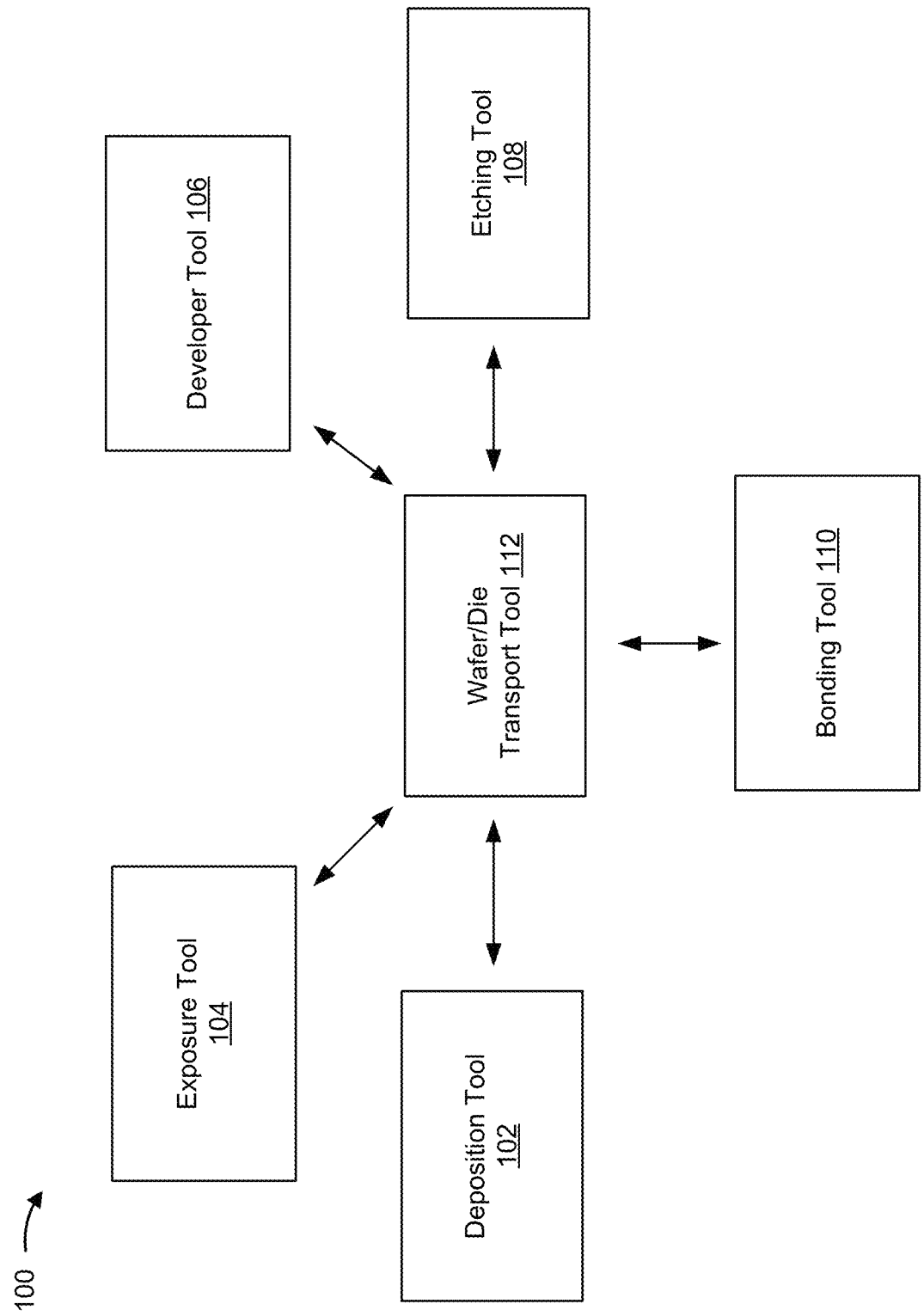
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A micro-electromechanical-system (MEMS) device may include multiple devices or wafers that are bonded together to form the MEMS device. For example, a MEMS device may include a circuitry wafer (e.g., a complementary metal oxide semiconductor (CMOS) wafer) that includes circuitry for the MEMS device, a device wafer that includes suspended mechanical components that function as actuator(s) of the MEMS device, and a cavity (or capping) wafer to seal the mechanical components in a cavity or micro-chamber. The circuitry wafer, the device wafer, and/or the capping wafer may be bonded together using a eutectic bonding process. Eutectic bonding is a wafer bonding technique by which the wafers of the MEMS device are heated to form a eutectic system between the materials of the wafers. The eutectic system typically includes silicon or germanium and a metal such as gold or aluminum. Because a eutectic system is formed, there may be no discernible interface between the bonded materials.

In some cases, the suspended mechanical components (e.g., moveable structures or actuators) may come in contact with other components or structures of the MEMS device. For example, the suspended mechanical components may come in contact with other components or structures of the MEMS device during operation of the MEMS device, during manufacturing of the MEMS device, and/or at other times. In some cases, the contact between the suspended mechanical components and other components or structures of the MEMS device may result in the suspended mechanical components becoming stuck to other components or structures, which can cause the MEMS device to fail.

Some implementations described herein provide a MEMS device that may be formed to include an anti-stiction polysilicon layer on one or more moveable MEMS structures (e.g., suspended mechanical components or actuators) of a device wafer of the MEMS device to reduce, minimize, and/or eliminate stiction (or sticking) between the moveable MEMS structures and other components or structures of the MEMS device. The anti-stiction polysilicon layer may be formed on a bottom surface of each of the moveable MEMS structures. The anti-stiction polysilicon layer may be formed such that a surface roughness of the anti-stiction polysilicon layer is greater than the surface roughness of a bonding polysilicon layer on the surfaces of the device wafer that are to be bonded to a circuitry wafer of the MEMS device. The higher surface roughness of the anti-stiction polysilicon layer reduces the surface area of the bottom of the moveable MEMS structures, which may reduce friction between the one or more moveable MEMS structures and other components or structures that may come into contact with the one or more moveable MEMS structures. This may reduce the likelihood that the one or more moveable MEMS structures will become stuck to the other components or structures. The lower surface roughness of the bonding polysilicon layer may provide a greater amount of surface area relative to the anti-stiction polysilicon layer, which may promote eutectic bonding between the device wafer and the circuitry wafer.

FIG. 1 is a diagram of an example environment 100 in which systems and/or methods described herein may be implemented. As shown in FIG. 1, environment 100 may include a plurality of semiconductor processing tools 102-110 and a wafer/die transport tool 112. The plurality of semiconductor processing tools 102-110 may include a deposition tool 102, an exposure tool 104, a developer tool 106, an etching tool 108, a bonding tool 110, and/or another type of semiconductor processing tool. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light source, and/or the like), an x-ray source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etching tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of a the substrate using a plasma etch or a plasma-assisted etch, which may involve using an ionized gas to isotopically or directionally etch the one or more portions.

The bonding tool 110 is a semiconductor processing tool that is capable of bonding two or more wafers (or two or more semiconductor substrates, or two or more semiconductor devices) together. For example, the bonding tool 110 may include a eutectic bonding tool that is capable of forming a eutectic bond between two or more wafers. In these examples, the bonding tool 110 may heat the two or more wafers to form a eutectic system between the materials of the two or more wafers.

Wafer/die transport tool 112 includes a mobile robot, a robot arm, a tram or rail car, and/or another type of device that are used to transport wafers and/or dies between semiconductor processing tools 102-110 and/or to and from other locations such as a wafer rack, a storage room, and/or the like. In some implementations, wafer/die transport tool 112 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
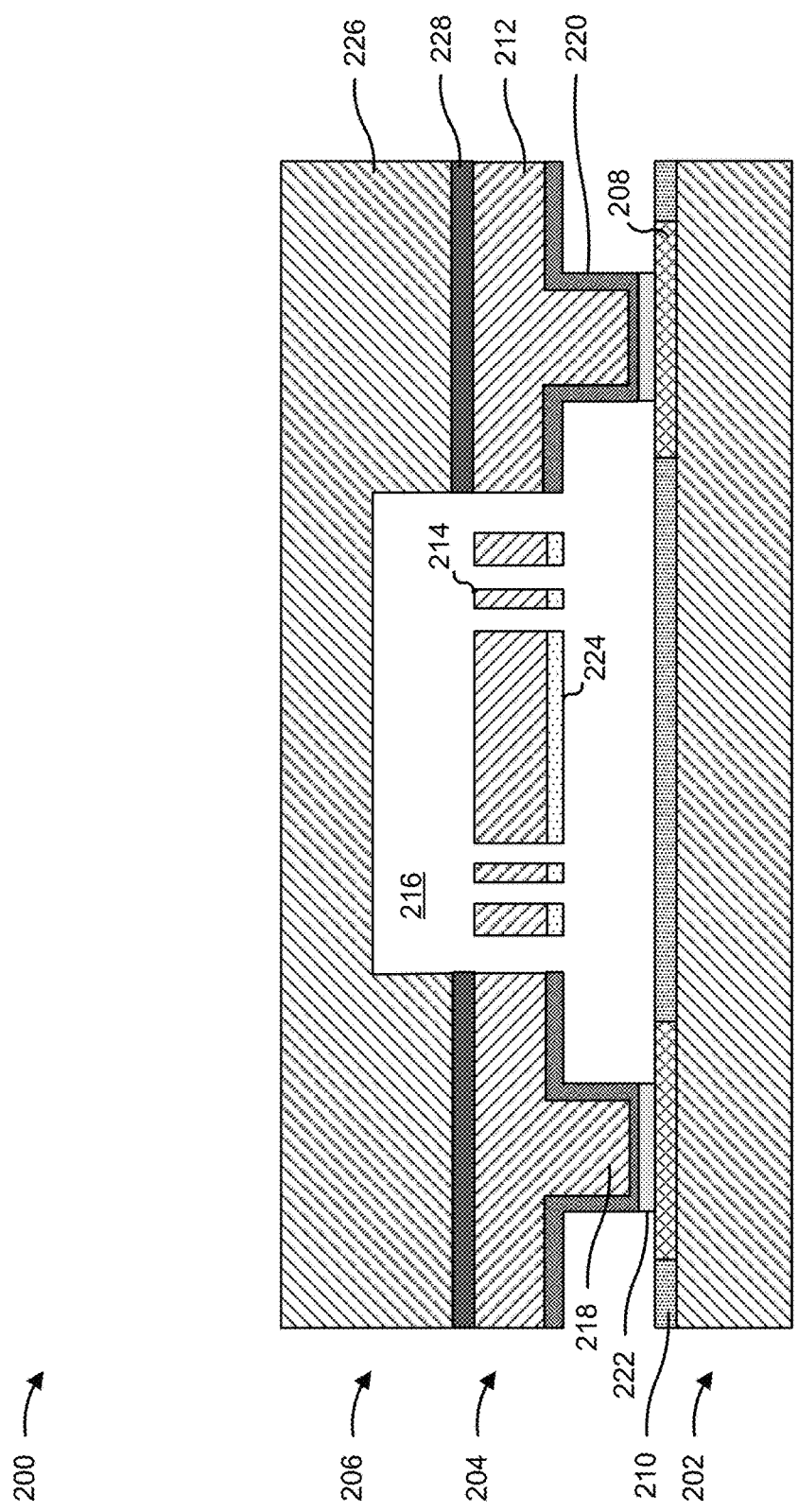
FIG. 2 is a diagram of an example semiconductor structure described herein.

FIG. 2 is a diagram of an example MEMS device 200 described herein. The MEMS device 200 may include an accelerometer, a microphone, a gyroscope, or another type of MEMS device that includes moveable MEMS structures or actuators. As shown in FIG. 2, the MEMS device 200 may include a circuitry wafer 202, a device wafer 204, and a capping wafer 206. The circuitry wafer 202 may be bonded with the device wafer 204 on a first side of the device wafer 204, and the capping wafer 206 may be bonded with the device wafer 204 on a second side of the device wafer 204 opposing the first side.

The circuitry wafer 202 may be a complementary metal oxide semiconductor (CMOS) wafer that includes semiconductor components such as transistors, inductors, capacitors, and/or resistors; that includes integrated circuits; and/or that includes interconnecting metallization layers of the MEMS device 200. The circuitry wafer 202 may include one or more metal bonding pads 208 formed of aluminum or another conductive material such as gold, tungsten, cobalt, among other examples. The metal bonding pad(s) 208 may be bonding pads for bonding the device wafer 204 and the circuitry wafer 202, and may provide electrical connections to the circuitry and interconnecting metallization layers of the MEMS device 200. A passivation layer 210 may be disposed between adjacent metal bonding pads 208 on a surface of the circuitry wafer 202 to provide electrical isolation. The passivation layer 210 may be formed of a dielectric material, such as a silicon nitride ($SiN_x$), a silicon carbide ($SiC_x$), or a mixture thereof, such as a silicon carbon nitride (SiCN), a silicon oxynitride (SiON), or another type of dielectric material. In some implementations, the circuitry wafer 202 may include connections to packaging or solder pads of the MEMS device 200.

The device wafer 204 is formed from a semiconductor substrate 212 such as a silicon substrate. One or more moveable MEMS structures 214 may be formed in the device wafer 204 (e.g., in the substrate 212 of the device wafer 204), which may function as MEMS actuators for the MEMS device 200. The moveable MEMS structure(s) 214 may be formed by etching through portions of the substrate 212 to form elongated members that are suspended above the circuitry wafer 202 by a lateral connection to a side of the substrate 212 of the device wafer 204. In this way, the moveable MEMS structure(s) 214 are permitted to move or displace to function as vibrating masses, elastic strings or coils, or other types of actuators for performing functions in sensors, gyroscopes, microphones, accelerometers, RF devices, or optical devices.

The moveable MEMS structure(s) 214 may be located in a cavity 216 of the MEMS device 200. The cavity 216 may be a hermetically sealed micro-chamber in which a vacuum is formed to prevent outgassing and to prevent foreign objects and other contamination from damaging the moveable MEMS structure(s) 214. The cavity 216 may be formed from the combination of the circuitry wafer 202, the device wafer 204, and the capping wafer 206, which may enclose the moveable MEMS structure(s) 214 in the cavity 216.

The device wafer 204 may be supported on the circuitry wafer 202 by (and may be bonded to the circuitry wafer 202 at) one or more support structures 218 formed in and/or on the substrate 212. The support structure(s) 218 may function as standoffs for the moveable MEMS structure(s) 214 such that the moveable MEMS structure(s) 214 are permitted to be suspended above the circuitry wafer 202. The support structure(s) 218 may be coated with a polysilicon layer 220 to promote and/or increase adhesion between the silicon of the substrate 212 and one or more germanium bonding pads 222 on the polysilicon layer 220 over the support structure(s) 218. The germanium bonding pad(s) 222 may be used to form a eutectic bond between the germanium bonding pad(s) 222 and the associated metal bonding pad(s) 208 to bond the device wafer 204 and the circuitry wafer 202. In this way, the germanium bonding pad(s) 222 may increase the quality and strength of the bond between the circuitry wafer 202 and the device wafer 204.

The quality and strength of the eutectic bond between the circuitry wafer 202 and the device wafer 204 may be further increased by the polysilicon layer 220. The polysilicon layer 220 may be formed to a sufficiently low surface roughness to reduce the likelihood of peeling or delamination of the germanium bonding pad(s) 222 from the polysilicon layer 224. Maintaining a low surface roughness for the polysilicon layer 220 increases the surface area of the polysilicon layer 220, which increases the friction between the germanium bonding pad(s) 222 and the polysilicon layer 220. The increased friction provides stronger adhesion between the germanium bonding pad(s) 222 and the polysilicon layer 220 and resists peeling and delamination.

The polysilicon layer 220 may be formed to a root means square roughness (Rq) of approximately less than 30 nanometers, as the likelihood of peeling and delamination of the germanium bonding pad(s) 222 from the polysilicon layer 224 may increase at and above approximately 30 nanometers. The polysilicon layer 220 may be formed to a thickness equal to or less than approximately 10,000 angstroms to control the surface roughness of the polysilicon layer 220 such that the root means square roughness (Rq) of the polysilicon layer 220 is approximately less than 30 nanometers. The surface roughness of the polysilicon layer 220 may increase to above approximately 30 nanometers as the thickness of the polysilicon layer 220 increases above approximately 10,000 angstroms.

Another polysilicon layer 224 may be included on the moveable MEMS structure(s) 214. In particular, the polysilicon layer 224 may be included on a bottom surface of the moveable MEMS structure(s) 214. The polysilicon layer 224 may be an anti-stiction layer in that the polysilicon layer 224 is included on the bottom surface of the moveable MEMS structure(s) 214 to reduce, minimize, and/or eliminate the likelihood of stiction between the moveable MEMS structure(s) 214 and the circuitry wafer 202 (e.g., the passivation layer 210 of the circuitry wafer 202). The polysilicon layer 224 may be formed to a sufficiently high surface roughness to reduce the likelihood of stiction between the moveable MEMS structure(s) 214 and the passivation layer 210. The high surface roughness of the polysilicon layer 224 decreases the surface area of the polysilicon layer 224, which decreases friction between the moveable MEMS structure(s) 214 and the passivation layer 210 when the moveable MEMS structure(s) 214 come into contact with the passivation layer 210. The decreased friction reduces the likelihood that the moveable MEMS structure(s) 214 will become permanently stuck to the passivation layer 210.

Since the surface roughness of the polysilicon layer 220 may be configured to promote adhesion, the surface roughness of the polysilicon layer 224 may be different from the surface roughness of the polysilicon layer 220 to reduce, minimize, and/or eliminate the likelihood of stiction between the moveable MEMS structure(s) 214 and the circuitry wafer 202. In particular, the surface roughness of the polysilicon layer 224 may be greater than the surface roughness of the polysilicon layer 220 to reduce, minimize, and/or eliminate the likelihood of stiction between the moveable MEMS structure(s) 214 and the circuitry wafer 202. In some implementations, the particular root means square roughness (Rq) to which the polysilicon layer 224 is formed may be based on a specified performance parameter for the MEMS device 200. For example, the polysilicon layer 220 may be formed to a root means square roughness (Rq) of greater than approximately 30 nanometers to withstand stiction of the moveable MEMS structure(s) 214 for a particular quantity of drop test cycles (e.g., 10,000 drop test cycles). As another example, the polysilicon layer 220 may be formed to a root means square roughness (Rq) of greater than approximately 40 nanometers to withstand stiction for a greater quantity of drop test cycles than if the polysilicon layer 220 were formed to a root means square roughness (Rq) of approximately 30 nanometers but less than approximately 40 nanometers. A drop test cycle may include dropping the MEMS device 200 from a distance to attempt to cause a failure of the MEMS device 200. Drop test cycling may be performed to determine a durability of the MEMS device 200, to determine a reliability of the MEMS device 200, and/or to determine other performance parameters of the MEMS device 200.

The capping wafer 206 may include a substrate 226 formed from a silicon wafer or another type of wafer that is used in semiconductor processing that is capable of being etched and having mechanical strength and material composition to form the cavity 216 within the MEMS device 200. The capping wafer 206 may be bonded to the device wafer 204 by an oxide layer 228. As an example, the capping wafer 206 and the device wafer 204 may be fusion bonded by the intervening oxide layer 228. The oxide layer 228 may include an oxide material such as a silicon oxide, a silicon dioxide, or another type of oxide material.

The number and arrangement of structures, layers, and/or the like shown in FIG. 2 is provided as an example. In practice, a MEMS structure may include additional structures and/or layers, fewer structures and/or layers, different structures and/or layers, or differently arranged structures and/or layers than those shown in FIG. 2.

FIGS. 3A-3K are diagrams of an example 300 of forming the MEMS device 200 of FIG. 2. In some implementations, the one or more semiconductor processing tools 102-110 may perform one or more of the techniques and/or processes described in connection with FIGS. 3A-3K. In some implementations, one or more of the techniques and/or processes described in connection with FIGS. 3A-3K may be performed by other semiconductor processing tools.

Figure 3A:
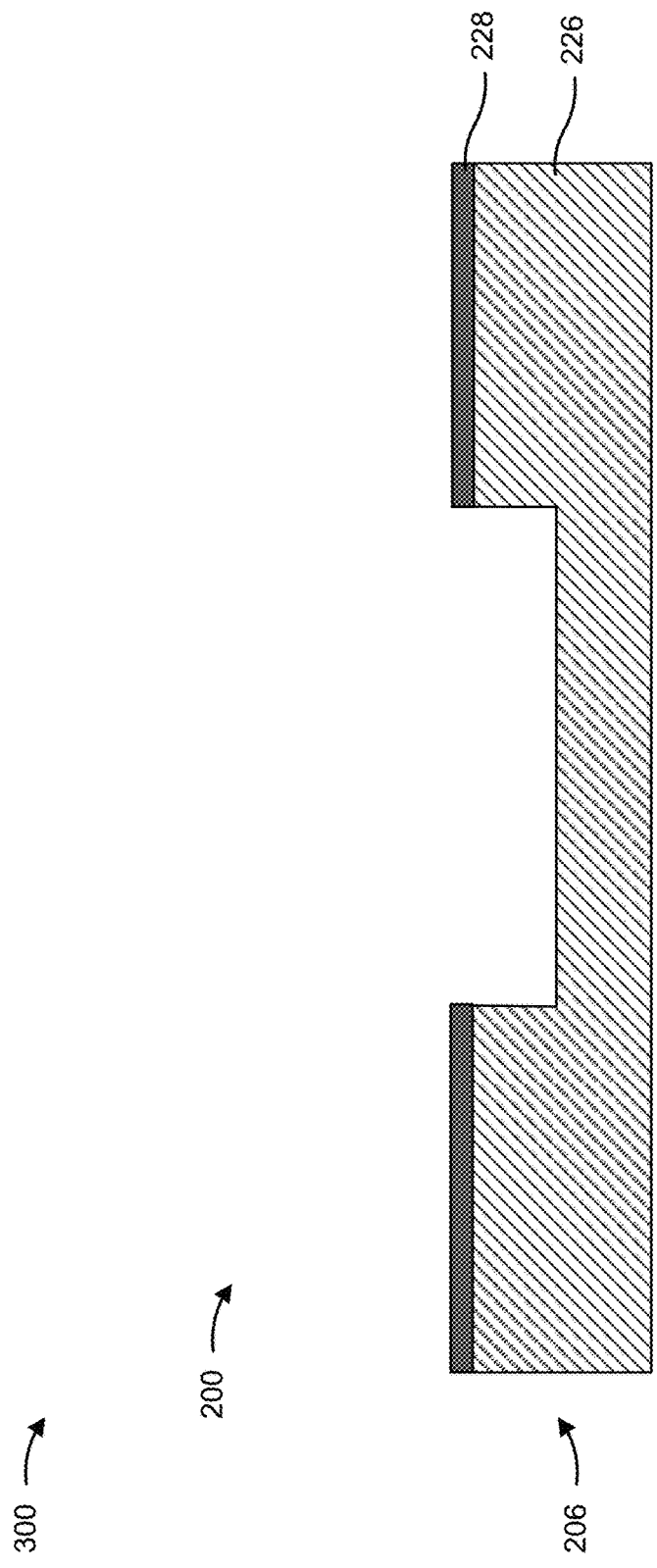
FIGS. 3A-3K are diagrams of an example implementation described herein.
Figure 3B:
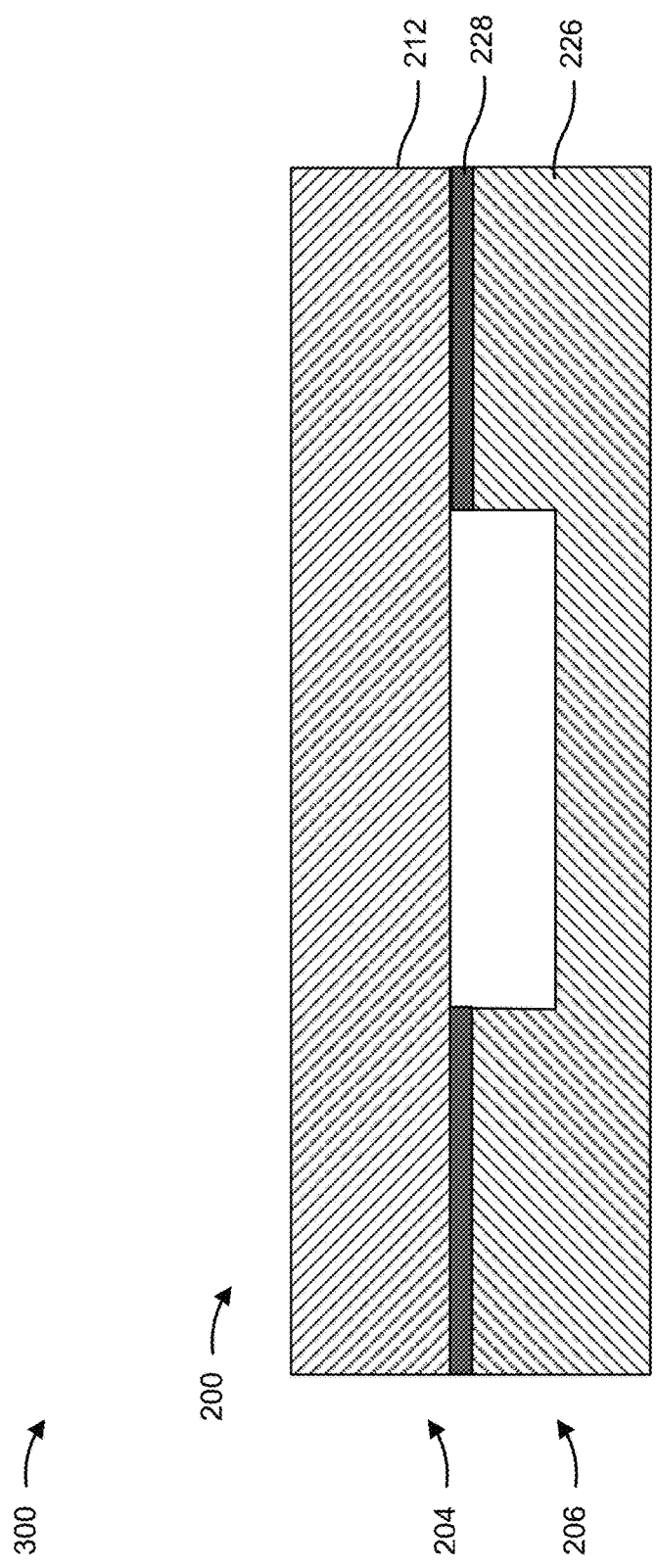

As shown in FIG. 3A, the oxide layer 228 may be formed on the capping wafer 206. For example, the deposition tool 102 may deposit the oxide layer 228 on the capping wafer 206 using a CVD process, a PVD process, an ALD process, or another type of deposition process. As shown in FIG. 3B, the capping wafer 206 and the device wafer 204 may be bonded together by the intervening oxide layer 228. In particular, the bonding tool 110 may fusion bond the capping wafer 206 and the device wafer 204 together by the intervening oxide layer 228. The fusion bond may form a hermetic seal between the capping wafer 206 and the device wafer 204.

Fusion bonding the capping wafer 206 and the device wafer 204 using the oxide layer 228 may include pressing the device wafer 204 against the oxide layer 228 on the capping wafer 206 and performing an annealing process to cause the capping wafer 206 and the device wafer 204 to be bonded together due to atomic attraction forces. The fusion bonding process may be used to bond silicon structures together (such as the capping wafer 206 and the device wafer 204) by silicon oxide ($SiO_x$) to silicon (Si) bonding, which may occur between the capping wafer 206 and the oxide layer 228, and between the device wafer 204 and the oxide layer 228.

Figure 3C:
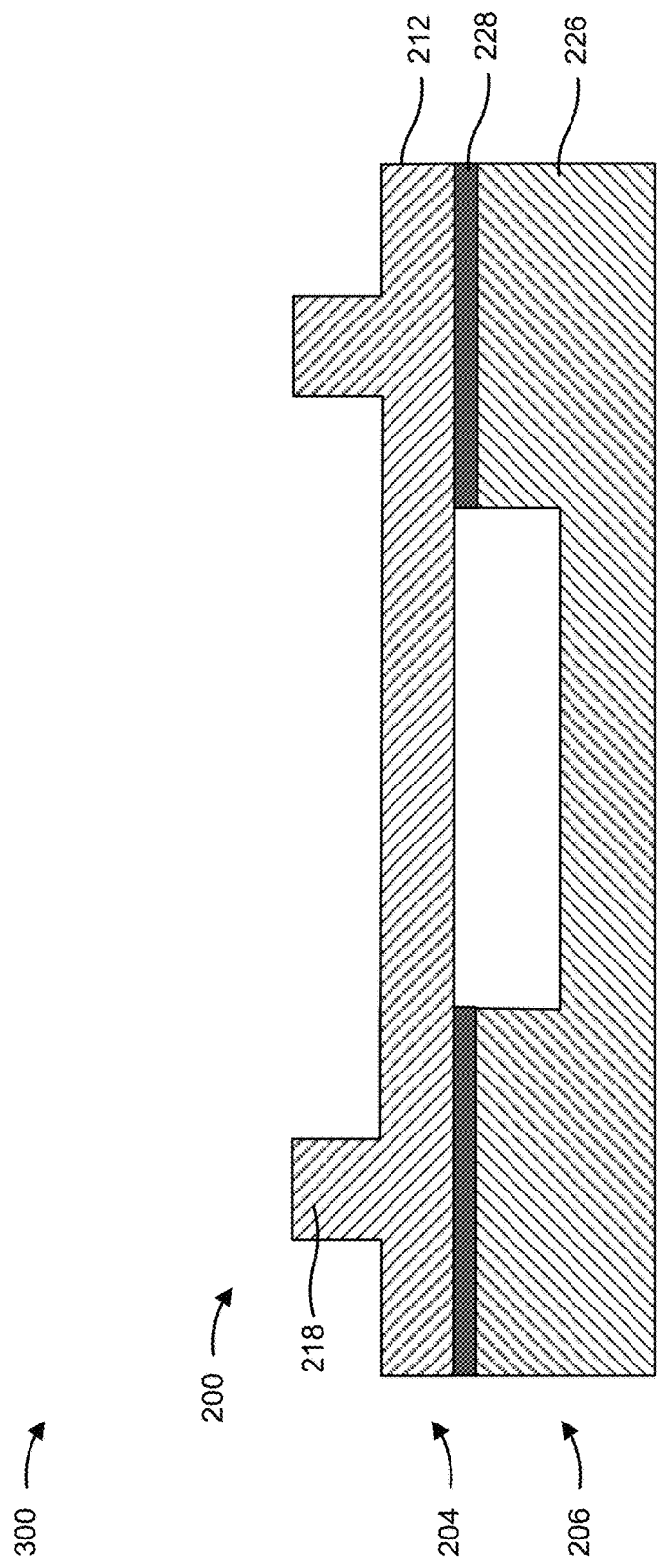

As shown in FIG. 3C, one or more semiconductor processing tools may form the support structure(s) 218 of the device wafer 204. The deposition tool 102 may deposit a photoresist layer on the substrate 212 (e.g., by a spin coating operation). The exposure tool 104 may form a pattern in the photoresist layer by exposing the photoresist layer to a radiation source, such as a UV source (e.g., a deep UV light source, an extreme UV (EUV) light source, and/or the like), an x-ray source, or an electron beam (e-beam) source, to transfer the pattern from a photomask to the photoresist layer. The developer tool 106 may perform a development operation that includes one or more techniques to develop the pattern in the photoresist layer. After the pattern has been developed, the substrate 212 may be rinsed to remove any residual chemical developer and spin-dried. The etching tool 108 may etch the substrate 212 based on the pattern formed in the photoresist layer to form the support structure(s) 218 of the device wafer 204. For example, the etching tool 108 may perform a wet etching technique (e.g., where the substrate 212 is exposed or submerged in a chemical that etches or removes material from the substrate 212 at a particular etch rate), a dry etching device (e.g., where a plasma is used to sputter material from the substrate 212), or another type of etching technique. The remaining portions of the photoresist layer may be removed from the substrate 212 after the substrate 212 is etched to form the support structure(s) 218. In some implementations, a solvent or chemical stripper is used to remove the remaining portions of the photoresist layer. In some implementations, a plasma ashing process is used to remove the remaining portions of the photoresist layer. In these examples, a plasma source is used to form a plasma of oxygen ions or fluorine ions to react with the photoresist material. The reaction between the ions in the plasma and the photoresist material causes the photoresist material to form an ash, which is removed using a vacuum pump.

Figure 3D:
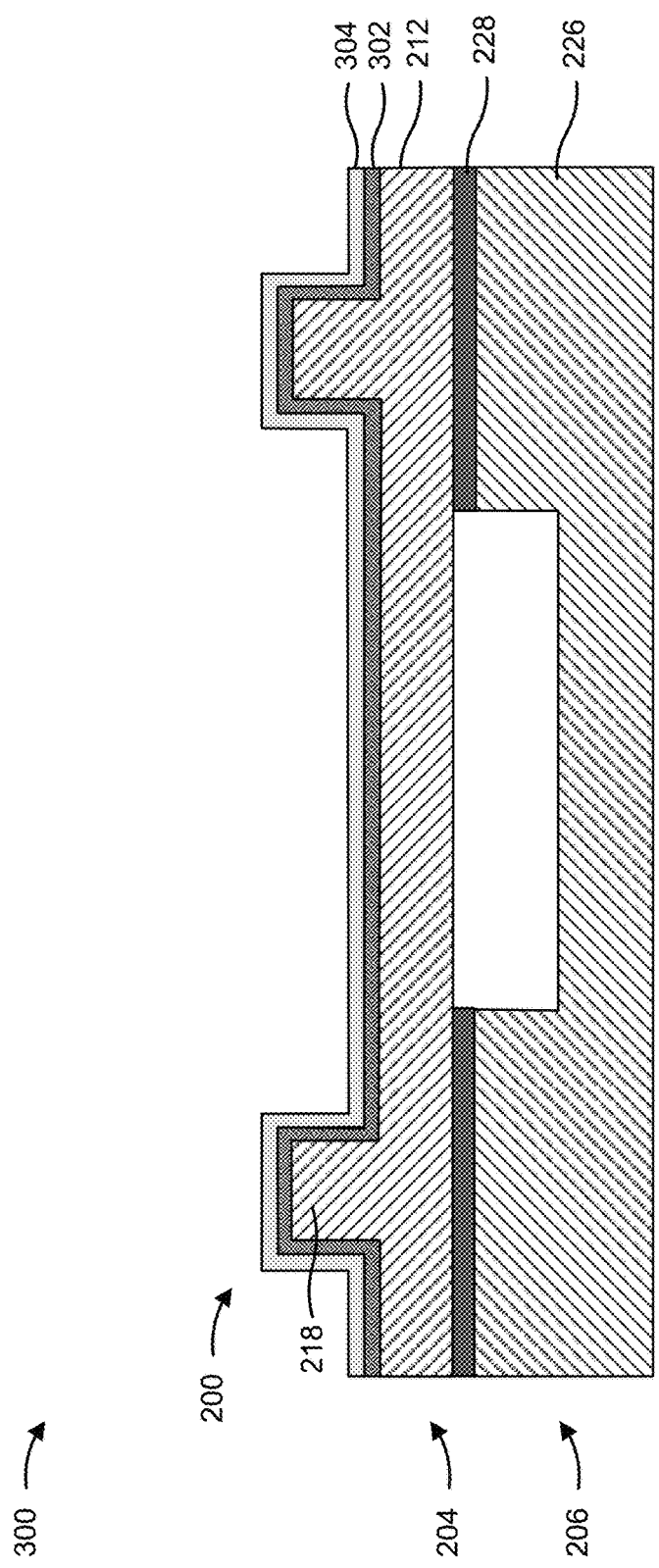

As shown in FIG. 3D, a semiconductor processing tool may form a polysilicon layer 302 over and/or on the device wafer 204. In particular, the semiconductor processing tool may form the polysilicon layer 302 over and/or on the substrate 212 of the device wafer 204, including over and/or on the support structure(s) 218. For example, the deposition tool 102 may deposit the polysilicon layer 302 over and/or on the substrate 212 of the device wafer 204, including over and/or on the support structure(s) 218 using a CVD process, a PVD process, an ALD process, or another type of deposition process.

The polysilicon layer 220 and the polysilicon layer 224 may be formed from the polysilicon layer 302, in which case polysilicon layer 220 and the polysilicon layer 224 may be deposited in a single (the same) deposition operation. Accordingly, the deposition tool 102 may deposit the polysilicon layer 302 to a particular thickness such that a particular surface roughness for the polysilicon layer 302 is achieved. Specifically, the deposition tool 102 may deposit the polysilicon layer 302 to a thickness that is equal to or less than approximately 10,000 angstroms to achieve root means square roughness (Rq) of less than approximately 30 nanometers for the polysilicon layer 302.

As further shown in FIG. 3D, the deposition tool 102 may deposit an oxide layer 304 over and/or on the polysilicon layer 220 using a CVD process, a PVD process, an ALD process, or another type of deposition process. The oxide layer 304 may be formed of an oxide material such as a silicon oxide, a silicon dioxide, or another material containing an oxide. The oxide layer 304 may be deposited to at least partially oxidize the top surface of the polysilicon layer 302. Oxidation of the polysilicon layer 302 may be one part in the process of increasing the surface roughness of a portion of the polysilicon layer 302 that is to become the polysilicon layer 224.

Figure 3E:
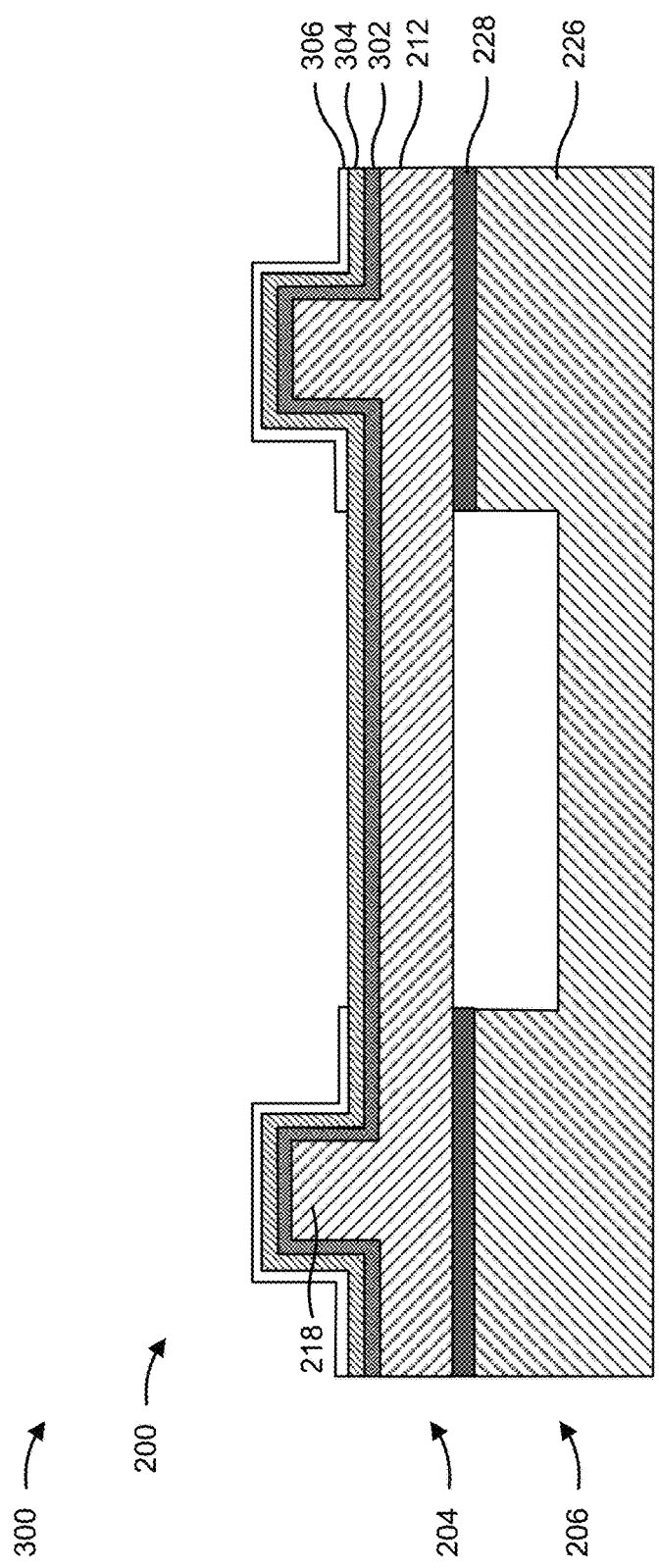

As shown in FIG. 3E, one or more semiconductor processing tools may form a photoresist layer 306 on the oxide layer 304 over the support structure(s) 218 and one or more portions of the polysilicon layer 302 that are to become the polysilicon layer 220. In this way, the one or more portions of the polysilicon layer 302 that are to become the polysilicon layer 220 are protected from etching to maintain a low surface roughness. The deposition tool 102 may deposit the photoresist layer 306 on the oxide layer 304 (e.g., by a spin coating operation). The exposure tool 104 may form a pattern in the photoresist layer 306 by exposing the photoresist layer 306 to a radiation source, such as a UV source (e.g., a deep UV light source, an EUV light source, and/or the like), an x-ray source, or an e-beam source, to transfer the pattern from a photomask to the photoresist layer 306. The developer tool 106 may perform a development operation that includes one or more techniques to develop the pattern in the photoresist layer 306. After the pattern has been developed, the oxide layer 304 may be rinsed to remove any residual chemical developer and spin-dried. The pattern in the photoresist layer 306 may be formed such that the portion of the oxide layer 304 that is to be etched, and the portion of the polysilicon layer 302 that is to become the polysilicon layer 224, are exposed.

Figure 3F:
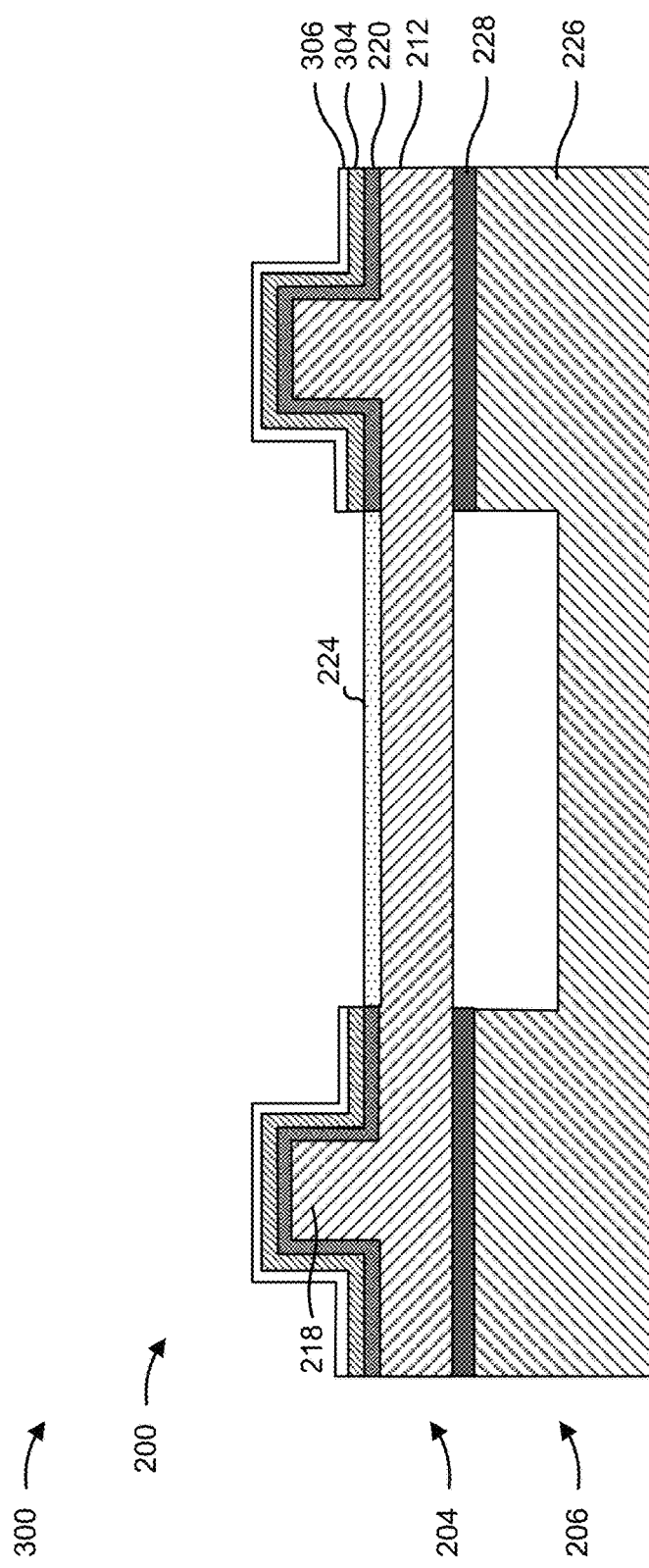

As shown in FIG. 3F, a semiconductor processing tool may remove the portion of the oxide layer 304 exposed by the pattern in the photoresist layer 306. In particular, the etching tool 108 may perform a wet etching operation or a dry etching operation to etch the exposed portion of the oxide layer 304 to remove the exposed portion of the oxide layer 304. The etching tool 108 may further etch the top surface of the portion of the polysilicon layer 302 under the exposed portion of the oxide layer 304. As described above, the top surface of the polysilicon layer 302 may be at least partially oxidized by the intervening oxide layer 304. The oxidization of the top surface of the polysilicon layer 302 may decrease the etch selectivity of the polysilicon layer 302. Accordingly, the oxidization of the top surface of the polysilicon layer 302 may result in the top surface of the polysilicon layer 302, under the exposed portion of the oxide layer 304, being etched during the etching operation. The combination of the oxidization of the top surface of the polysilicon layer 302 under the exposed portion of the oxide layer 304 and the etching of the top surface of the polysilicon layer 302 under the exposed portion of the oxide layer 304 increases the surface roughness of the polysilicon layer 302 under the exposed portion of the oxide layer 304 (e.g., relative to the portion(s) of the oxide layer 304 under the photoresist layer 306 which are to become the polysilicon layer 220). Accordingly, the etching operation results in the formation of the polysilicon layer 220 and the polysilicon layer 224.

The duration of the etching operation, an etch rate of the etchant used in the etching operation, and/or other parameters of the etching operation may be selected to achieve a particular surface roughness for the polysilicon layer 224. In some implementations, the particular surface roughness may be determined or selected based on a threshold quantity of drop test cycles to be survived by the MEMS device 200. For example, the duration of the etching operation and/or the etch rate of the etchant may be increased to increase the surface roughness in order to satisfy a greater threshold quantity of drop test cycles. As another example, the duration of the etching operation and/or the etch rate of the etchant may be decreased to provide a smaller increase in the surface roughness to satisfy a lower threshold quantity of drop test cycles. In some implementations, the particular surface roughness may be determined or selected based on a drop force or gravitational force equivalent (g-force) that is to be survived by the MEMS device 200 without failure. For example, the duration of the etching operation and/or the etch rate of the etchant may be increased to increase the surface roughness in order to satisfy a greater drop force. As another example, the duration of the etching operation and/or the etch rate of the etchant may be decreased to provide a smaller increase in surface roughness to satisfy a lower drop force.

Figure 3G:
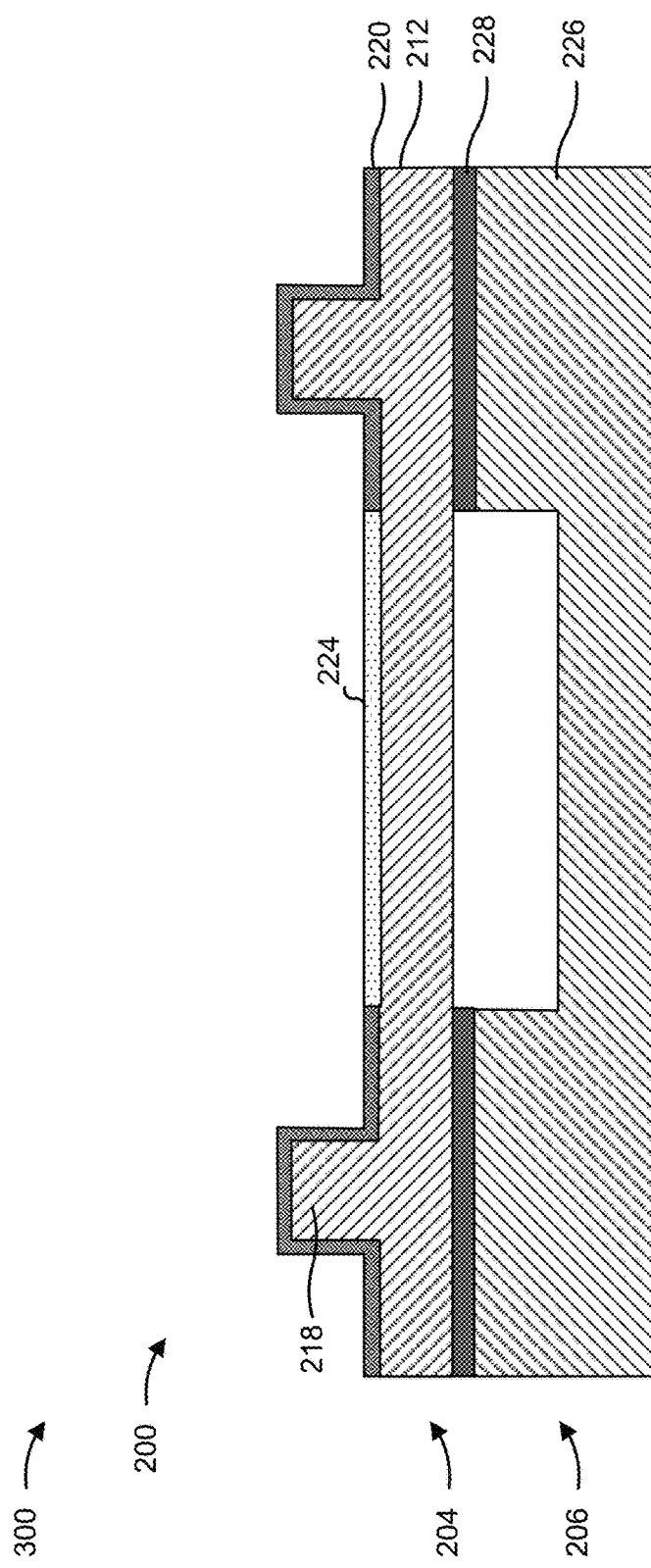

As shown in FIG. 3G, the remaining portions of the photoresist layer 306 may be removed from the oxide layer 304 after the oxide layer 304 (and the portion of the polysilicon layer 302) is etched to form the polysilicon layer 220 and the poly silicon layer 224. In some implementations, a solvent or chemical stripper is used to remove the remaining portions of the photoresist layer 306. In some implementations, a plasma ashing process is used to remove the remaining portions of the photoresist layer 306. In these examples, a plasma source is used to form a plasma of oxygen ions or fluorine ions to react with the photoresist material. The reaction between the ions in the plasma and the photoresist material causes the photoresist material to form an ash, which is removed using a vacuum pump.

Figure 3H:
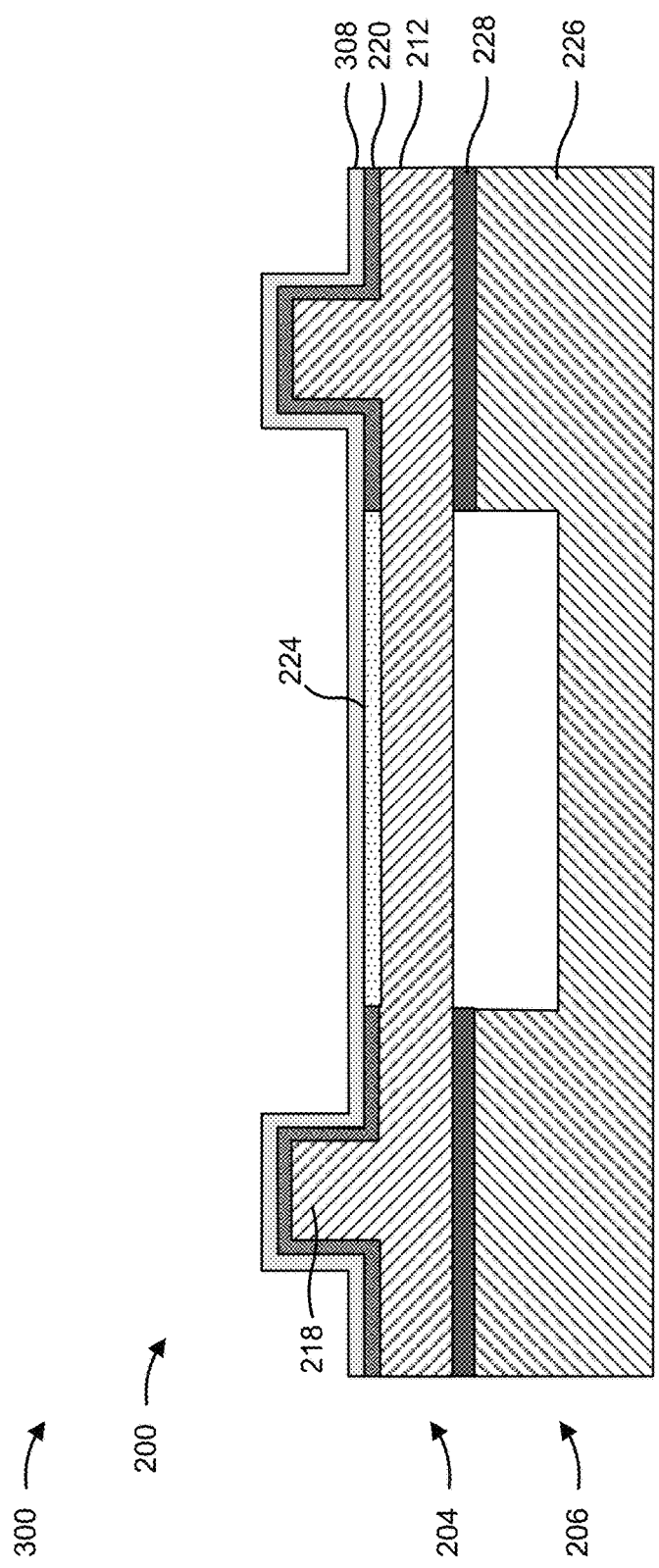

As shown in FIG. 3H, a germanium layer 308 may be deposited onto the polysilicon layer 220 and the polysilicon layer 224. For example, a semiconductor processing tool (e.g., the deposition tool 102) may deposit the germanium layer 308 onto the polysilicon layer 220 and the polysilicon layer 224 using a CVD process, a PVD process, an ALD process, or another type of deposition process.

Figure 3I:
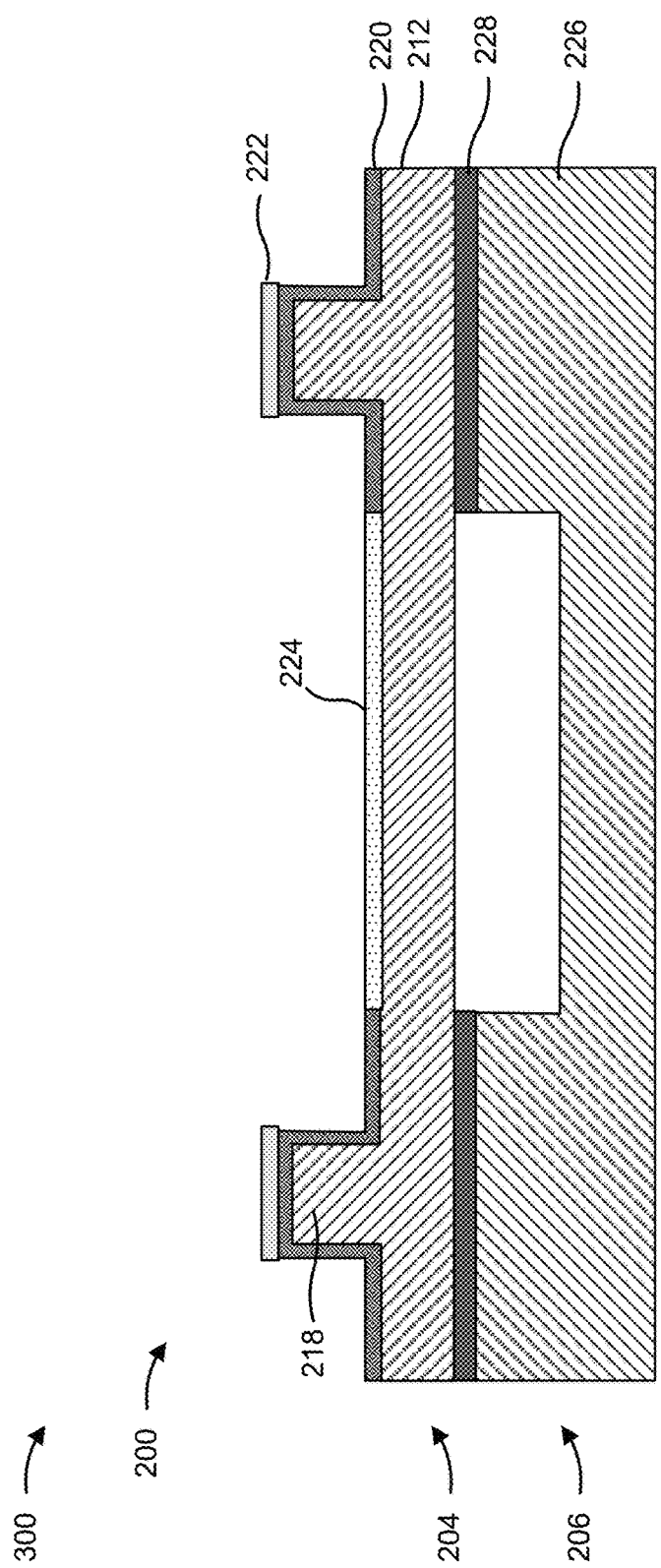

As shown in FIG. 3I, one or more semiconductor processing tools may form the germanium bonding pad(s) 222. The deposition tool 102 may deposit a photoresist layer on the polysilicon layer 224 and the polysilicon layer 220 by a spin coating operation. The exposure tool 104 may form a pattern in the photoresist layer by exposing the photoresist layer to a radiation source to transfer the pattern from a photomask to the photoresist layer. The developer tool 106 may perform a development operation that includes one or more techniques to develop the pattern in the photoresist layer. After the pattern has been developed, the polysilicon layer 224 and the polysilicon layer 220 may be rinsed to remove any residual chemical developer and spin-dried. The etching tool 108 may etch the germanium layer 308 such that the portions of the germanium layer 308 are removed from the polysilicon layer 224 and from one or more portions of the polysilicon layer 220 (e.g., one or more portions of the polysilicon layer 220 that are not over the support structure(s) 218) based on the pattern formed in the photoresist layer to form the germanium bonding pad(s) 222 over the support structure(s) 218. In some implementations, a solvent or chemical stripper is used to remove the remaining portions of the photoresist layer. In some implementations, a plasma ashing process is used to remove the remaining portions of the photoresist layer. In these examples, a plasma source is used to form a plasma of oxygen ions or fluorine ions to react with the photoresist material. The reaction between the ions in the plasma and the photoresist material causes the photoresist material to form an ash, which is removed using a vacuum pump.

Figure 3J:
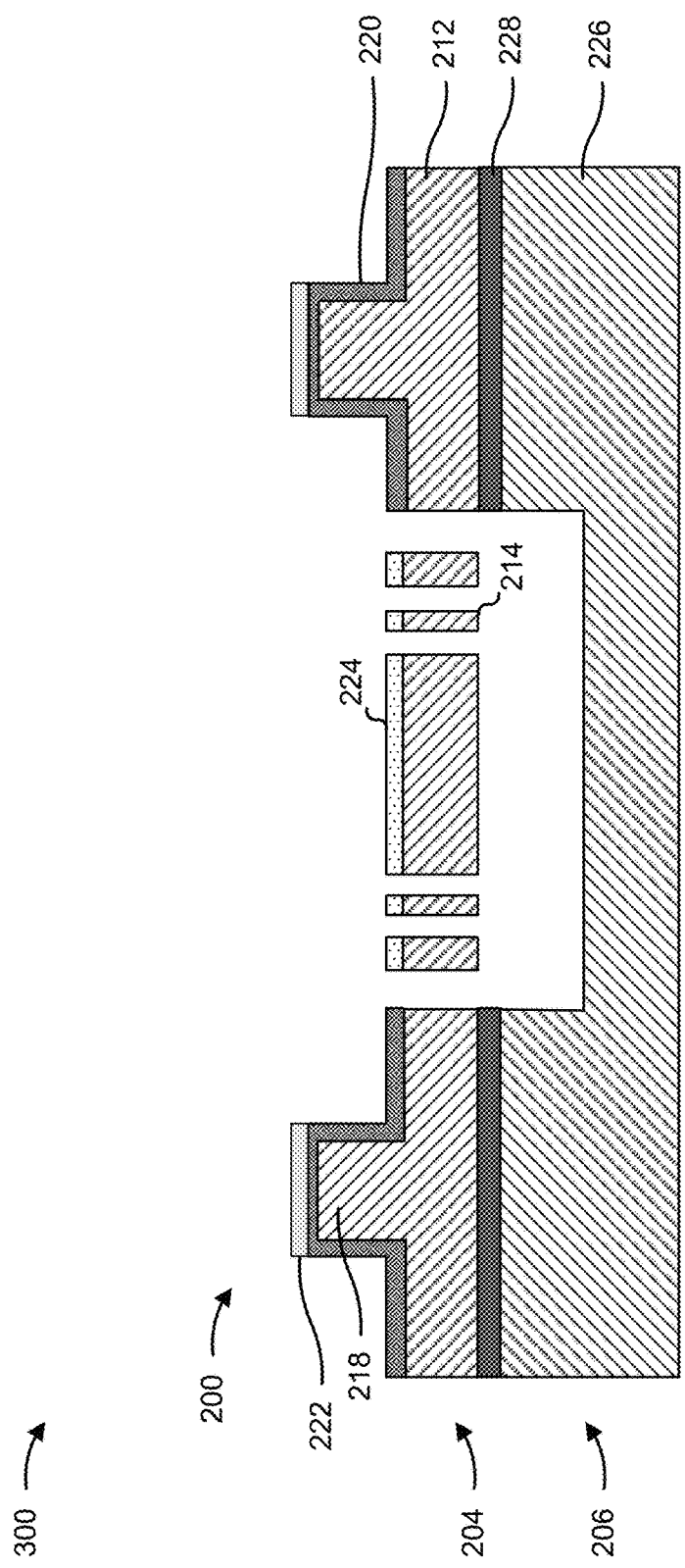

As shown in FIG. 3J, one or more semiconductor processing tools may form the moveable MEMS structure(s) 214. The deposition tool 102 may deposit a photoresist layer on the polysilicon layer 224, the polysilicon layer 220, and the germanium bonding pad(s) 222 by a spin coating operation. The exposure tool 104 may form a pattern in the photoresist layer by exposing the photoresist layer to a radiation source to transfer the pattern from a photomask to the photoresist layer. The developer tool 106 may perform a development operation that includes one or more techniques to develop the pattern in the photoresist layer. The etching tool 108 may etch through one or more portions of the polysilicon layer 224 and through one or more associated portions of the substrate 212 to form the moveable MEMS structure(s) 214. In some implementations, a solvent or chemical stripper is used to remove the remaining portions of the photoresist layer. In some implementations, a plasma ashing process is used to remove the remaining portions of the photoresist layer. In these examples, a plasma source is used to form a plasma of oxygen ions or fluorine ions to react with the photoresist material. The reaction between the ions in the plasma and the photoresist material causes the photoresist material to form an ash, which is removed using a vacuum pump.

Figure 3K:
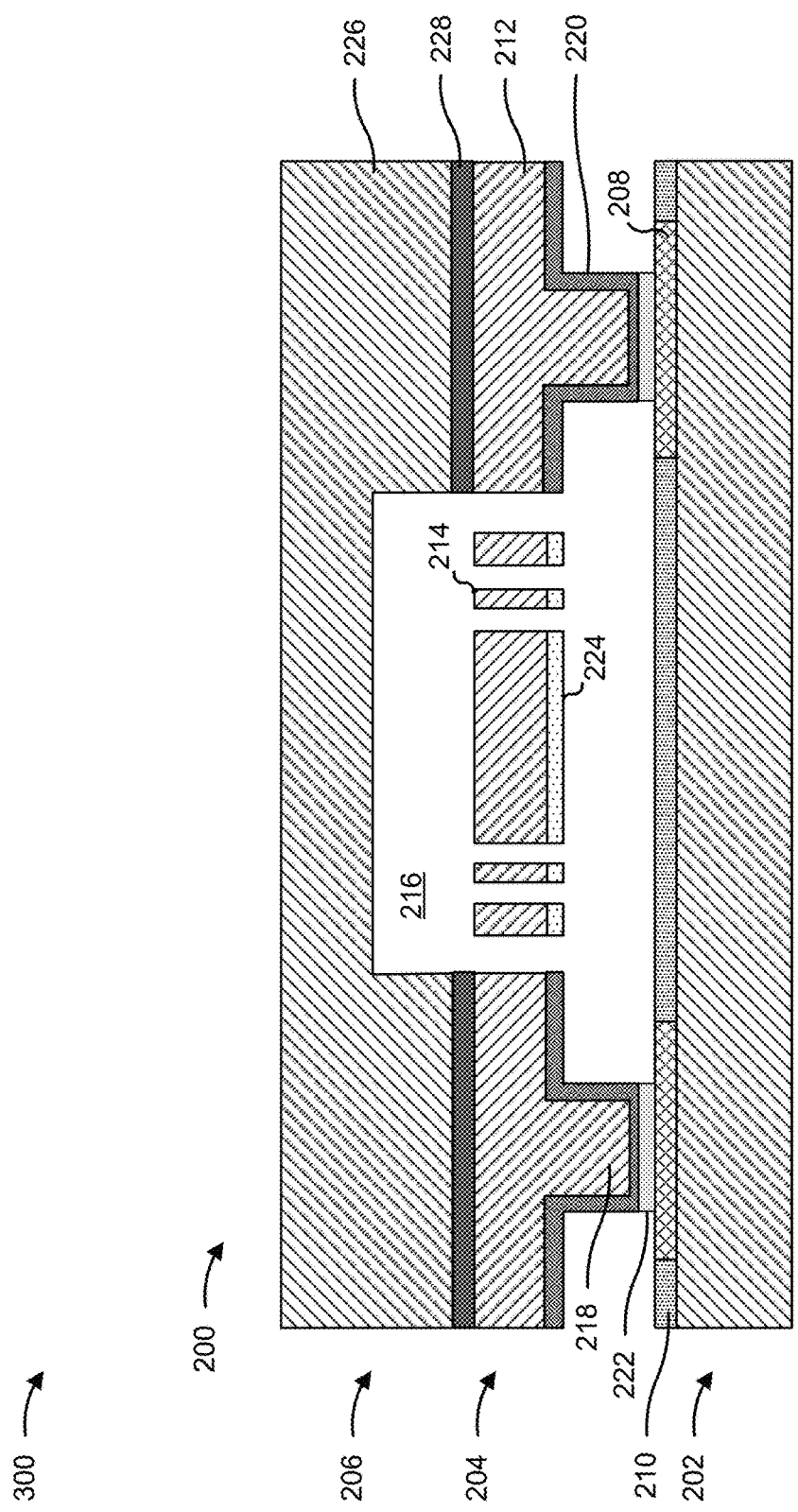

As shown in FIG. 3K, the device wafer 204 and the circuitry wafer 202 may be bonded. A semiconductor processing tool (e.g., the bonding tool 110) may bond the device wafer 204 and the circuitry wafer 202 by performing a eutectic bonding process to form a eutectic bond between the germanium bonding pad(s) 222 of the device wafer 204 and the metal bonding pad(s) 208 of the circuitry wafer 202. Eutectic bonding may be referred to as a low-temperature bonding in that the bonds between the materials of the germanium bonding pad(s) 222 and the metal bonding pad(s) 208 are formed at a temperature below the melting temperature of the materials of the germanium bonding pad(s) 222 and the metal bonding pad(s) 208. The bonding tool 110 may heat the device wafer 204 and the circuitry wafer 202 such that eutectic bonds are formed between the germanium bonding pad(s) 222 and the metal bonding pad(s) 208. For example, if the metal bonding pad(s) 208 are formed of an aluminum material, the bonding tool 110 may heat the device wafer 204 and the circuitry wafer 202 such that the germanium bonding pad(s) 222 and the metal bonding pad(s) 208 are heated to approximately 425 degrees Celsius to form the eutectic bonds. In some implementations, the eutectic bonding process may be combined with an annealing process (e.g., where the circuitry wafer 202 and the device wafer 204 are heated to a high temperature of 1100 degrees Celsius or more) to reduce the stress at the bonding interfaces resulting from the eutectic bonding process.

The eutectic bonds between the device wafer 204 and the circuitry wafer 202, and the fusion bond between the device wafer 204 and the capping wafer 206 forms the cavity 216 in which the moveable MEMS structures 214 are hermitically sealed. The cavity 216 permits the moveable MEMS structure(s) 214 to freely move or actuate, and prevents foreign objects and other contamination from damaging the moveable MEMS structure(s) 214.

As indicated above, FIGS. 3A-3K are provided as an example. Other examples may differ from what is described with regard to FIGS. 3A-3K.

Figure 4:
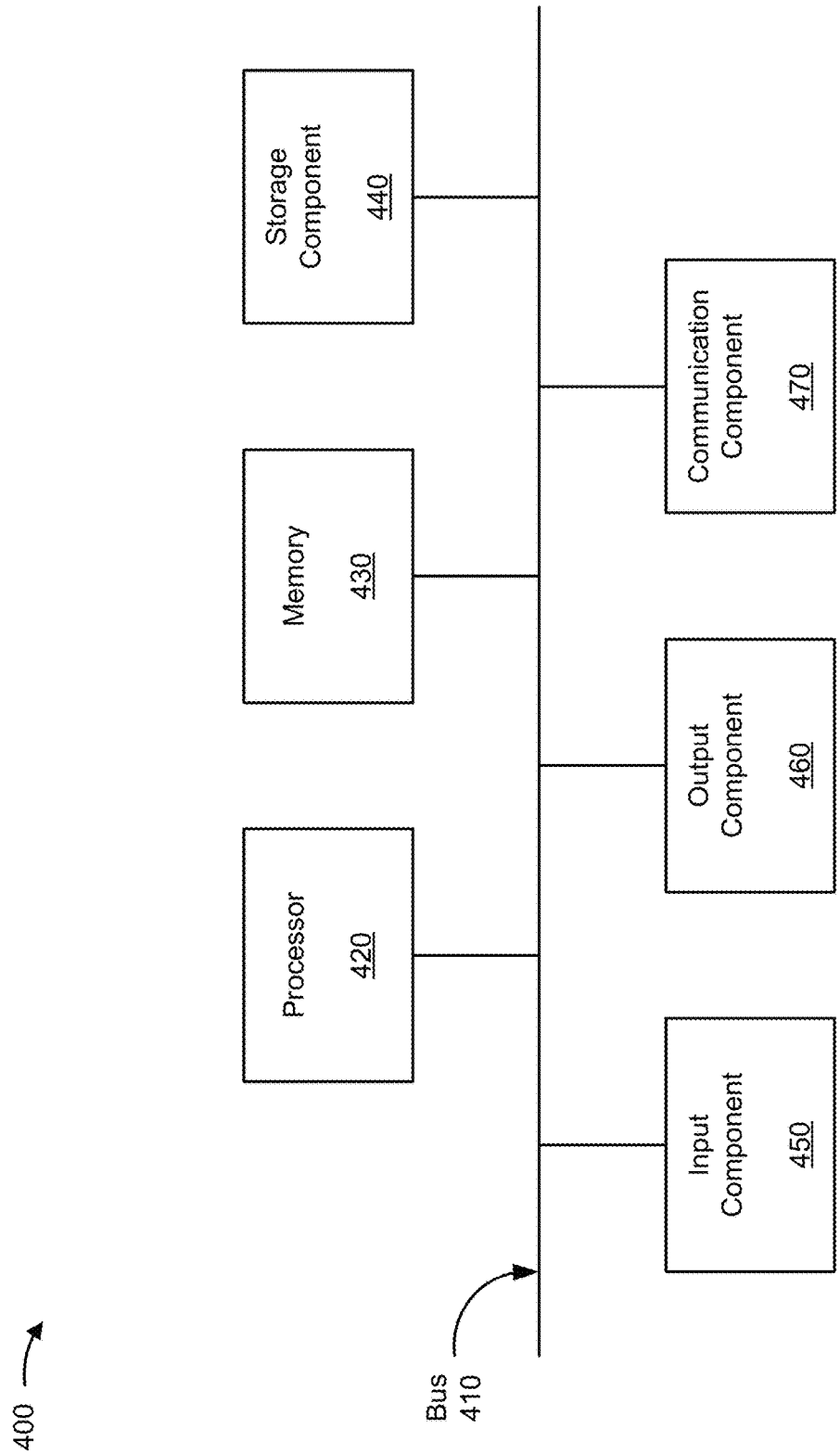
FIG. 4 is a diagram of example components of one or more devices of FIG. 1.

FIG. 4 is a diagram of example components of a device 400. In some implementations, one or more of the semiconductor processing tools 102-110 and/or the wafer/die transport tool 112 may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory, a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, and/or an actuator. Output component 460 enables device 400 to provide output, such as via a display, a speaker, and/or one or more light-emitting diodes. Communication component 470 enables device 400 to communicate with other devices, such as via a wired connection and/or a wireless connection. For example, communication component 470 may include a receiver, a transmitter, a transceiver, a modem, a network interface card, and/or an antenna.

Device 400 may perform one or more processes described herein. For example, a non-transitory computer-readable medium (e.g., memory 430 and/or storage component 440) may store a set of instructions (e.g., one or more instructions, code, software code, and/or program code) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
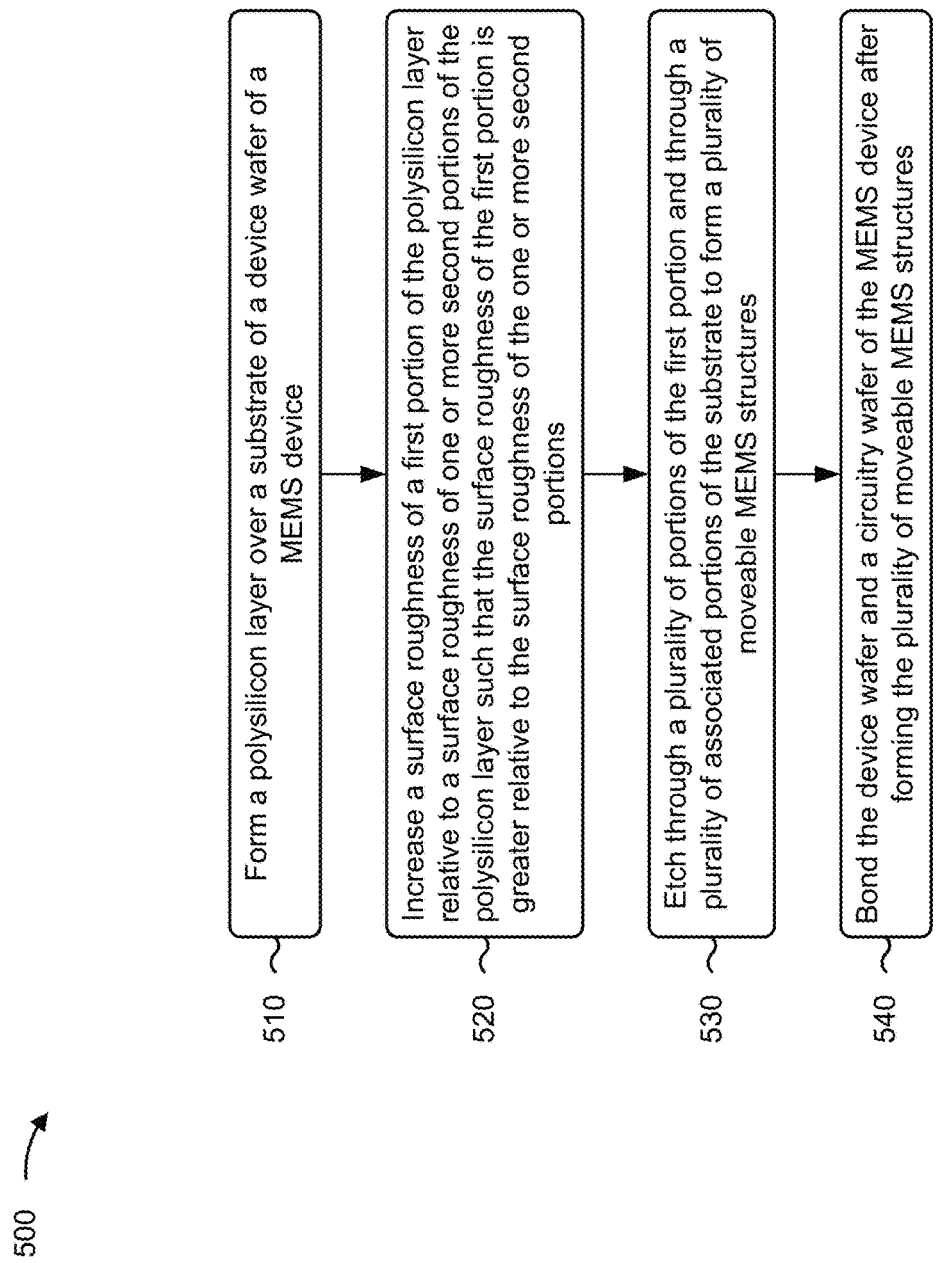
FIG. 5 is a flowchart of an example process relating to forming a semiconductor structure described herein.

FIG. 5 is a flowchart of an example process 500 associated with forming a semiconductor device described herein. In some implementations, one or more process blocks of FIG. 5 may be performed by one or more semiconductor processing tools (e.g., one or more of the semiconductor processing tools 102-110). Additionally, or alternatively, one or more process blocks of FIG. 5 may be performed by one or more components of device 400, such as processor 420, memory 430, storage component 440, input component 450, output component 460, and/or communication component 470.

As shown in FIG. 5, process 500 may include forming a polysilicon layer over a substrate of a device wafer of a MEMS device (block 510). For example, a semiconductor processing tool (e.g., the deposition tool 102) may form the polysilicon layer 302 over the substrate 212 of the device wafer 204 of the MEMS device 200, as described above.

As further shown in FIG. 5, process 500 may include increasing a surface roughness of a first portion of the polysilicon layer relative to a surface roughness of one or more second portions of the polysilicon layer such that the surface roughness of the first portion is greater relative to the surface roughness of the one or more second portions (block 520). For example, one or more semiconductor processing tools (e.g., the deposition tool 102, the exposure tool 104, the developer tool 106, the etching tool 108, and/or another semiconductor processing tool) may increase a surface roughness of a first portion (e.g., polysilicon layer 224) of the polysilicon layer 302 relative to a surface roughness of one or more second portions (e.g., polysilicon layer 220) of the polysilicon layer 302 such that the surface roughness of the first portion is greater relative to the surface roughness of the one or more second portions, as described above.

As further shown in FIG. 5, process 500 may include etching through a plurality of portions of the first portion and through a plurality of associated portions of the substrate to form a plurality of moveable MEMS structures (block 530). For example, a semiconductor processing tool (e.g., the etching tool 108) may etch through a plurality of portions of the first portion and through a plurality of associated portions of the substrate 212 to form the plurality of moveable MEMS structures 214, as described above.

As further shown in FIG. 5, process 500 may include bonding the device wafer and a circuitry wafer of the MEMS device after forming the plurality of moveable MEMS structures (block 540). For example, a semiconductor processing tool (e.g., the bonding tool 110) may bond the device wafer 204 and the circuitry wafer 202 of the MEMS device 200 after forming the plurality of moveable MEMS structures 214, as described above.

Process 500 may include additional implementations, such as any single implementation or any combination of implementations described below and/or in connection with one or more other processes described elsewhere herein.

In a first implementation, the surface roughness of the one or more second portions in Rq is less than approximately 30 nanometers. In a second implementation, alone or in combination with the first implementation, process 500 includes bonding (e.g., by the bonding tool 110) the device wafer 204 and the capping wafer 206 of the MEMS device 200, and where forming the polysilicon layer 302 includes forming the polysilicon layer 302 after bonding the device wafer 204 and the capping wafer 206. In a third implementation, alone or in combination with one or more of the first and second implementations, bonding the device wafer 204 and the capping wafer 206 of the MEMS device 200 includes fusion bonding the device wafer 204 and the capping wafer 206.

In a fourth implementation, alone or in combination with one or more of the first through third implementations, process 500 includes forming (e.g., by the deposition tool 102) the germanium layer 308 on the first portion and on the one or more second portions prior to bonding the device wafer 204 and the circuitry wafer 202, and removing (e.g., by the deposition tool 102, the exposure tool 104, the developer tool 106, the etching tool 108, and/or another semiconductor processing tool) one or more portions of the germanium layer 308 on the first portion to form the one or more germanium bonding pads 222. In a fifth implementation, alone or in combination with one or more of the first through fourth implementations, bonding the device wafer 204 and the circuitry wafer 202 includes forming a eutectic bond between the one or more germanium bonding pads 222 and the one or more metal bonding pads 208 of the circuitry wafer 202.

In a sixth implementation, alone or in combination with one or more of the first through fifth implementations, increasing the surface roughness of the first portion includes forming (e.g., by the deposition tool 102) the oxide layer 304 on the polysilicon layer 302, where the oxide layer 304 oxidizes a top surface of the first portion, and etching (e.g., by the etching tool 108) the oxide layer 304 on the first portion, where oxidization of the top surface and etching the oxide layer 304 on the first portion increases the surface roughness of the first portion. In a seventh implementation, alone or in combination with one or more of the first through sixth implementations, forming the polysilicon layer 302 includes forming the polysilicon layer 302 to a thickness equal to or less than approximately 10,000 angstroms.

In an eighth implementation, alone or in combination with one or more of the first through seventh implementations, increasing the surface roughness of the first portion includes increasing the surface roughness of the first portion to decrease a likelihood of stiction between the plurality of moveable MEMS structures 214 and the passivation layer 210 on the circuitry wafer 202. In a ninth implementation, alone or in combination with one or more of the first through eighth implementations, increasing the surface roughness of the first portion includes increasing the surface roughness of the first portion to decrease surface area on a bottom of the plurality of moveable MEMS structures 214. In a tenth implementation, alone or in combination with one or more of the first through ninth implementations, increasing the surface roughness of the first portion includes increasing the surface roughness of the first portion to a particular surface roughness such that the MEMS device 200 satisfies a threshold quantity of drop test cycles.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

In this way, a MEMS device may be formed to include an anti-stiction polysilicon layer on one or more moveable MEMS structures of a device wafer of the MEMS device to reduce, minimize, and/or eliminate stiction between the moveable MEMS structure(s) and other components or structures of the MEMS device. The anti-stiction polysilicon layer may be formed on a bottom surface of each of the moveable MEMS structure(s). The anti-stiction polysilicon layer may be formed such that a surface roughness of the anti-stiction polysilicon layer is greater than the surface roughness of a bonding polysilicon layer on the surfaces of the device wafer that are to be bonded to a circuitry wafer of the MEMS device. The higher surface roughness of the anti-stiction polysilicon layer may reduce the surface area of the bottom of the moveable MEMS structure(s), which may reduce friction between the moveable MEMS structure(s) and other surfaces that may come into contact with the moveable MEMS structure(s). This may reduce the likelihood that the moveable MEMS structure(s) will become stuck to the other surfaces. The lower surface roughness of the bonding polysilicon layer may provide a greater amount of surface area relative to the anti-stiction polysilicon layer, which may promote eutectic bonding between the device wafer and the circuitry wafer.

As described in greater detail above, some implementations described herein provide a MEMS device. The MEMS device includes a capping wafer. The MEMS device includes a circuitry wafer. The MEMS device includes a device wafer between the capping wafer and the circuitry wafer. The MEMS device includes one or more moveable MEMS structures in a cavity formed by the capping wafer, the circuitry wafer, and the device wafer. The MEMS device includes a first polysilicon layer on a bottom surface of the one or more moveable MEMS structures. The MEMS device includes a second polysilicon layer between the device wafer and the circuitry wafer, where a surface roughness of the first polysilicon layer is different from a surface roughness of the second polysilicon layer.

As described in greater detail above, some implementations described herein provide a method. The method includes forming a polysilicon layer over a substrate of a device wafer of a MEMS device. The method includes increasing a surface roughness of a first portion of the polysilicon layer relative to a surface roughness of one or more second portions of the polysilicon layer such that the surface roughness of the first portion is greater relative to the surface roughness of the one or more second portions. The method includes etching through a plurality of portions of the first portion and through a plurality of associated portions of the substrate to form a plurality of moveable MEMS structures. The method includes bonding the device wafer and a circuitry wafer) of the MEMS device after forming the plurality of moveable MEMS structures.

As described in greater detail above, some implementations described herein provide a MEMS device. The MEMS device includes a capping wafer. The MEMS device includes a circuitry wafer comprising a \ metal bonding pad. The MEMS device includes a device wafer, between the capping wafer and the circuitry wafer, comprising, a support structure and a germanium bonding pad between the metal bonding pad and the support structure. The MEMS device includes one or more moveable MEMS structures in a cavity formed by the capping wafer, the circuitry wafer, and the device wafer. The MEMS device includes a first polysilicon layer on a bottom surface of the one or more moveable MEMS structures. The MEMS device includes a second polysilicon layer between, the support structure and the germanium bonding pad, where a surface roughness of the first polysilicon layer is different from a surface roughness of the second polysilicon layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a polysilicon layer over a substrate of a device wafer of a micro-electromechanical-system (MEMS) device;
    increasing a surface roughness of a first portion of the polysilicon layer relative to a surface roughness of a second portion of the polysilicon layer such that the surface roughness of the first portion is greater relative to the surface roughness of the second portion;
    etching through a plurality of portions of the first portion and through a plurality of associated portions of the substrate to form a plurality of moveable MEMS structures; and
    bonding the device wafer and a circuitry wafer of the MEMS device after forming the plurality of moveable MEMS structures.

2. The method of claim 1, wherein the surface roughness of the second portion in root means square roughness (Rq) is less than approximately 30 nanometers.

3. The method of claim 1, wherein increasing the surface roughness of the first portion comprises:
    forming an oxide layer on the polysilicon layer,
        wherein the oxide layer oxidizes a top surface of the first portion; and
    etching the oxide layer on the first portion, and
        wherein oxidization of the top surface and etching the oxide layer on the first portion increases the surface roughness of the first portion.

4. The method of claim 1, wherein forming the polysilicon layer comprises:
    forming the polysilicon layer to a thickness equal to or less than approximately 10,000 angstroms.

5. The method of claim 1, wherein increasing the surface roughness of the first portion comprises:
    increasing the surface roughness of the first portion to decrease a likelihood of stiction between the plurality of moveable MEMS structures and a passivation layer on the circuitry wafer.

6. The method of claim 1, wherein increasing the surface roughness of the first portion comprises:
    increasing the surface roughness of the first portion to decrease surface area on a bottom of the plurality of moveable MEMS structures.

7. The method of claim 1, wherein increasing the surface roughness of the first portion comprises:
    increasing the surface roughness of the first portion to a particular surface roughness such that the MEMS device satisfies a threshold quantity of drop test cycles.

8. A method, comprising:
    etching through a plurality of portions, of a first portion of a polysilicon layer over a substrate of a device wafer of a micro-electromechanical-system (MEMS) device, and a plurality of associated portions, of the substrate of the device wafer, to form a plurality of MEMS structures,
        wherein a surface roughness of the first portion of the polysilicon layer is greater than a surface roughness of a second portion of the polysilicon layer; and
    bonding the device wafer and a circuitry wafer of the MEMS device after etching through the plurality of portions of the first portion and the plurality of associated portions of the substrate.

9. The method of claim 8, further comprising:
    bonding the device wafer and a capping wafer of the MEMS device; and
    wherein forming the polysilicon layer comprises:
        forming the polysilicon layer after bonding the device wafer and the capping wafer.

10. The method of claim 8, further comprising:
    bonding the device wafer and a capping wafer of the MEMS device; and
    wherein forming the polysilicon layer comprises:
        forming the polysilicon layer after bonding the device wafer and the capping wafer.

11. The method of claim 10, wherein bonding the device wafer and the capping wafer of the MEMS device comprises:
    fusion bonding the device wafer and the capping wafer.

12. The method of claim 8, further comprising:
    forming one or more germanium bonding pads on the first portion and on the one or more second portions prior to bonding the device wafer and the circuitry wafer.

13. The method of claim 12, wherein bonding the device wafer and the circuitry wafer comprises:
    forming a eutectic bond between the one or more germanium bonding pads and one or more metal bonding pads of the circuitry wafer.

14. A method, comprising:
    increasing a surface roughness, of a first portion of a polysilicon layer of a substrate of a device wafer of a micro-electromechanical-system (MEMS) device, relative to a surface roughness, of a second portion of the polysilicon layer, such that the surface roughness of the first portion is greater relative to the surface roughness of the second portion;

forming a plurality of moveable MEMS structures using the first portion and the substrate; and bonding the device wafer and a circuitry wafer of the MEMS device after forming the plurality of moveable MEMS structures.

15. The method of claim 14, wherein the plurality of moveable MEMS structures is formed via etching the first portion and the substrate.

16. The method of claim 14, further comprising:
depositing an oxide layer on the polysilicon layer,
   wherein forming the plurality of moveable MEMS structures is based on depositing the oxide layer on the polysilicon layer.

17. The method of claim 14, wherein forming the polysilicon layer comprises:
forming the polysilicon layer to a thickness equal to or less than approximately 10,000 angstroms.

18. The method of claim 14, further comprising:
bonding the device wafer and a capping wafer of the MEMS device; and
wherein forming the polysilicon layer comprises:
   forming the polysilicon layer based on bonding the device wafer and the capping wafer.

19. The method of claim 14, further comprising:
forming one or more germanium bonding pads on the first portion and the second portion.

20. The method of claim 19, wherein forming the one or more germanium bonding pads comprises:
forming a germanium layer on the first portion and on the second portion prior to bonding the device wafer and the circuitry wafer; and
removing one or more portions of the germanium layer on the first portion to form one or more germanium bonding pads.

* * * * *